United States Patent
Wu et al.

(10) Patent No.: US 9,385,191 B2
(45) Date of Patent: Jul. 5, 2016

(54) FINFET STRUCTURE

(71) Applicant: UNITED MICROELECTRONICS CORPORATION, Hsinchu (TW)

(72) Inventors: Yen-Liang Wu, Taipei (TW); Chung-Fu Chang, Tainan (TW); Wen-Jiun Shen, Douliou (TW); Man-Ling Lu, Gueishan Township (TW); Chia-Jong Liu, Gaoshu Township (TW); Yi-Wei Chen, Taichung (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/549,523

(22) Filed: Nov. 20, 2014

(65) Prior Publication Data

US 2016/0148998 A1  May 26, 2016

(51) Int. Cl.
*H01L 21/8238* (2006.01)
*H01L 21/762* (2006.01)
*H01L 29/66* (2006.01)
*H01L 29/06* (2006.01)
*H01L 29/78* (2006.01)
*H01L 27/092* (2006.01)

(52) U.S. Cl.
CPC ........ *H01L 29/0649* (2013.01); *H01L 27/0924* (2013.01); *H01L 29/7856* (2013.01)

(58) Field of Classification Search
CPC .................. H01L 21/823821; H01L 29/6681; H01L 21/76205
See application file for complete search history.

(56) References Cited

U.S. PATENT DOCUMENTS

| | | | |
|---|---|---|---|
| 7,329,571 B2 | 2/2008 | Hoentschel | |
| 7,622,344 B2 | 11/2009 | Liang | |
| 7,935,593 B2 | 5/2011 | Yang | |
| 8,426,265 B2 | 4/2013 | Bai | |
| 8,642,434 B2 | 2/2014 | Liu | |
| 2005/0082616 A1 | 4/2005 | Chen | |
| 2008/0199998 A1 | 8/2008 | Chen | |
| 2008/0303102 A1* | 12/2008 | Liang et al. | 257/397 |
| 2011/0210393 A1 | 9/2011 | Chen | |
| 2011/0223736 A1* | 9/2011 | Lin et al. | 438/305 |
| 2013/0032887 A1 | 2/2013 | He | |
| 2013/0228862 A1* | 9/2013 | Lee et al. | 257/347 |
| 2015/0091099 A1* | 4/2015 | Ching et al. | 257/401 |
| 2015/0111351 A1* | 4/2015 | Kim et al. | 438/218 |

* cited by examiner

*Primary Examiner* — Su C Kim
*Assistant Examiner* — David S Wilbert
(74) *Attorney, Agent, or Firm* — Ding Yu Tan

(57) ABSTRACT

A FINFET structure is provided. The FINFET structure includes a substrate, a PMOS element, a NMOS element, a STI structure, and a bump structure. The substrate includes a first area and a second area adjacent to the first area. The PMOS element is disposed in the first area of the substrate, and includes at least one first fin structure. The NMOS element is disposed in the second area of the substrate and includes at least one second fin structure. The STI structure is disposed between the first fin structure and the second fin structure. The bump structure is disposed on the STI structure and has a carbon-containing dielectric material.

5 Claims, 13 Drawing Sheets

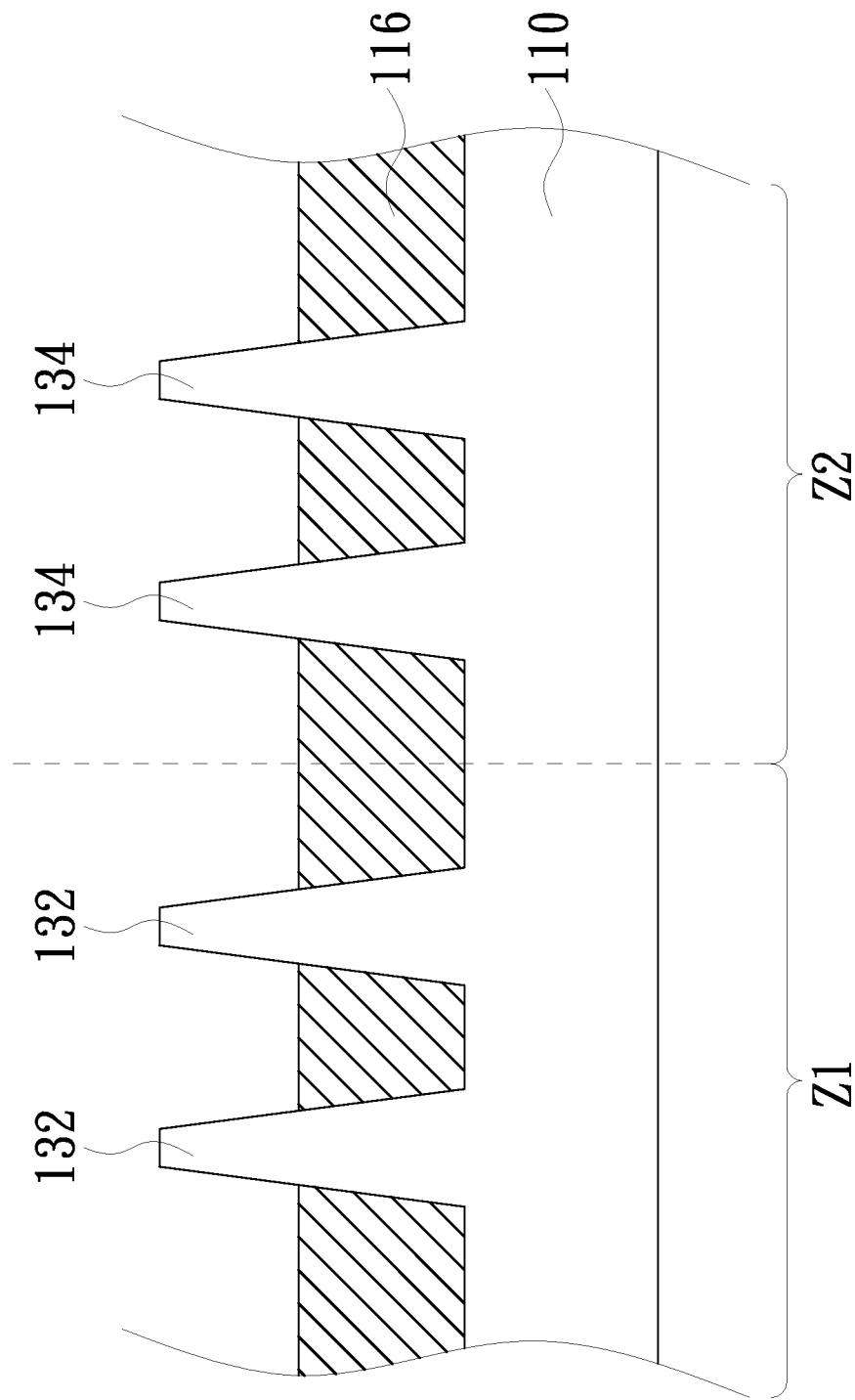

FINFET STRUCTURE

FIELD OF THE INVENTION

The present invention relates to a MOSFET structure, and more particularly to a FINFET (Fin Field-Effect Transistor) structure of a non-planar MOSFET.

BACKGROUND OF THE INVENTION

Shallow trench isolation (STI), also known as Box Isolation Technique, is an integrated circuit feature which prevents electrical current leakage between adjacent semiconductor device components and prevents ion penetration between two different doped regions.

But a common STI structure of a traditional metal-oxide-semiconductor field-effect transistor (MOSFET) may have a lower level than that of adjacent semiconductor device components, and that will cause a weaker ability in avoiding ion penetration issues and leakage current issues.

In view of the aforementioned reasons, there is a need to provide a new MOSFET structure to improve efficiency in preventing ion penetration issues and leakage current issues.

SUMMARY OF THE INVENTION

The present invention provides a FINFET structure of a non-planar MOSFET to improve efficiency in preventing ion penetration issues and leakage current issues.

In order to achieve the aforementioned advantages or other merits, a FINFET structure is provided in an embodiment of the present invention. The FINFET structure includes a substrate, a PMOS element, a NMOS element, a STI structure, and a bump structure. The substrate includes a first area and a second area adjacent to the first area. The PMOS element is disposed in the first area of the substrate and includes at least one first fin structure. The NMOS element is disposed in the second area of the substrate and includes at least one second fin structure. The STI structure is disposed between the first fin structure and the second fin structure. The bump structure is disposed on the STI structure and has a carbon-containing dielectric material.

In an embodiment, the first fin structure has a first top layer of epitaxial SiP.

In an embodiment, the second fin structure has a second top layer of epitaxial SiGe.

In an embodiment, the PMOS element further includes a first gate structure formed on the first fin structure.

In an embodiment, the NMOS element further includes a second gate structure formed on the second fin structure.

In an embodiment, the carbon-containing dielectric material is SiCN.

In summary, in the present invention, by disposing the bump structure having a carbon-containing dielectric material on the STI structure can improve insulation capability of the STI structure and improve efficiency of the FINFET structure in preventing ion penetration issues and leakage current issues.

For making the above and other purposes, features and benefits become more readily apparent to those ordinarily skilled in the art, the preferred embodiments and the detailed descriptions with accompanying drawings will be put forward in the following descriptions.

BRIEF DESCRIPTION OF THE DRAWINGS

The present invention will become more readily apparent to those ordinarily skilled in the art after reviewing the following detailed description and accompanying drawings, in which:

FIGS. 1A~1L schematically illustrate a process flow of a method for manufacturing a FINFET structure according to an embodiment of the present invention.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1B:
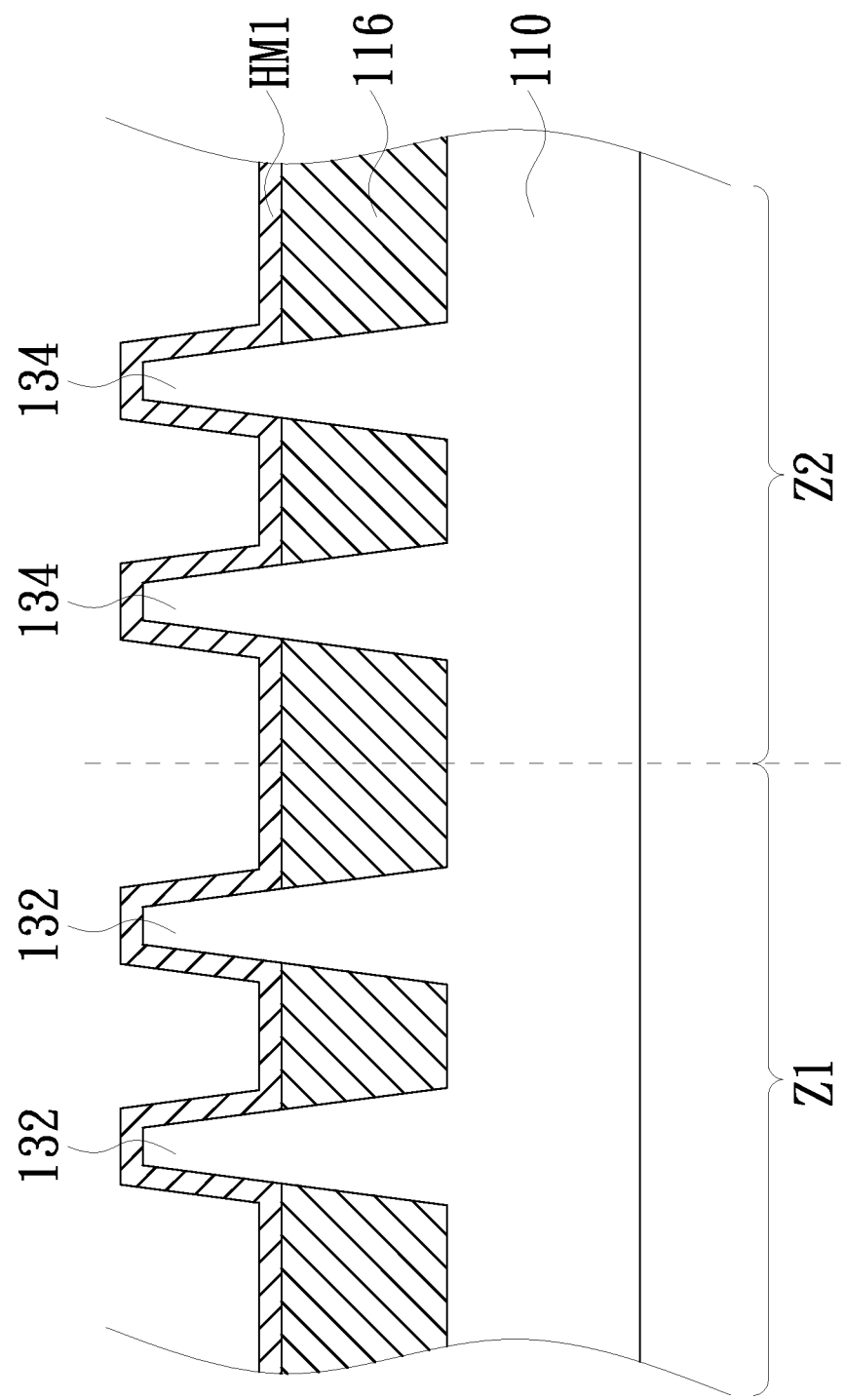

FIGS. 1A~1L schematically illustrate a process flow of a method for manufacturing a FINFET (Fin Field-Effect Transistor) structure according to an embodiment of the present invention. Please refer to FIGS. 1A~1B. The method for manufacturing a FINFET structure includes steps of: providing a substrate 110, which has a first area Z1 and a second area Z2 adjacent to the first area Z1, wherein at least one first fin structure 132 is formed in the first area Z1, at least one second fin structure 134 is formed in the second area Z2, and an insulation layer 116 is formed between the at least one first fin structure 132 and the at least one second fin structure 134 (as shown in FIG. 1A); forming a first hard mask HM1 conformally on the insulation layer 116, the first fin structure 132, and the second fin structure 134 (as shown in FIG. 1B), wherein the first hard mask HM1 has a carbon-containing dielectric material. The carbon-containing dielectric material is SiCN, for instance (as an example). It is worth mentioning that in FIG. 1A, two first fin structures 132 and two second fin structures 134 are expressly illustrated, while the number of the first fin structure 132 and of the second fin structure 134 are not to be limited to that shown in the figure FIG. 1A. So the insulation layer 116 has also been formed between two of the first fin structures 132 and between two of the second fin structures 134.

Figure 1C:
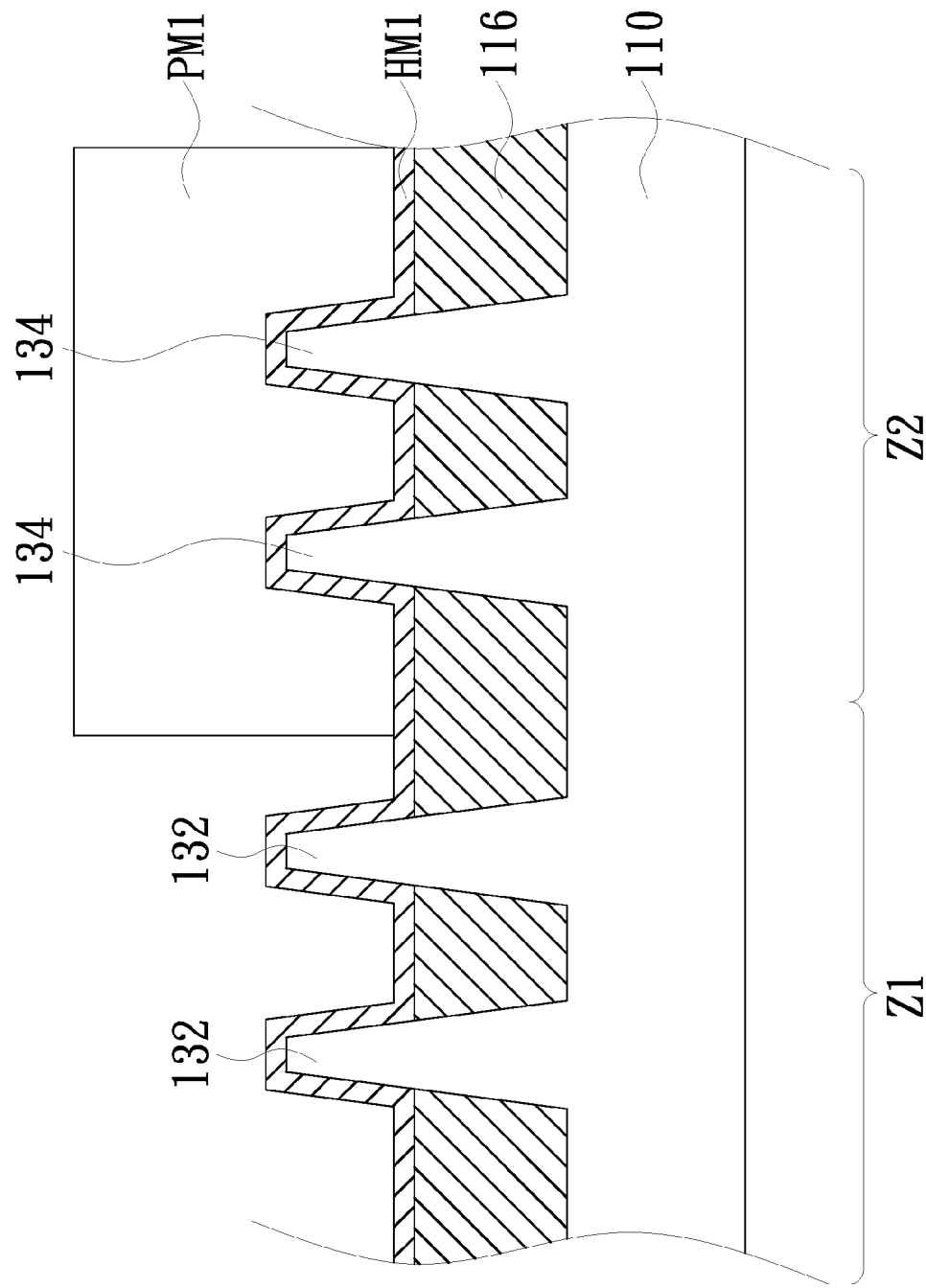
Figure 1D:
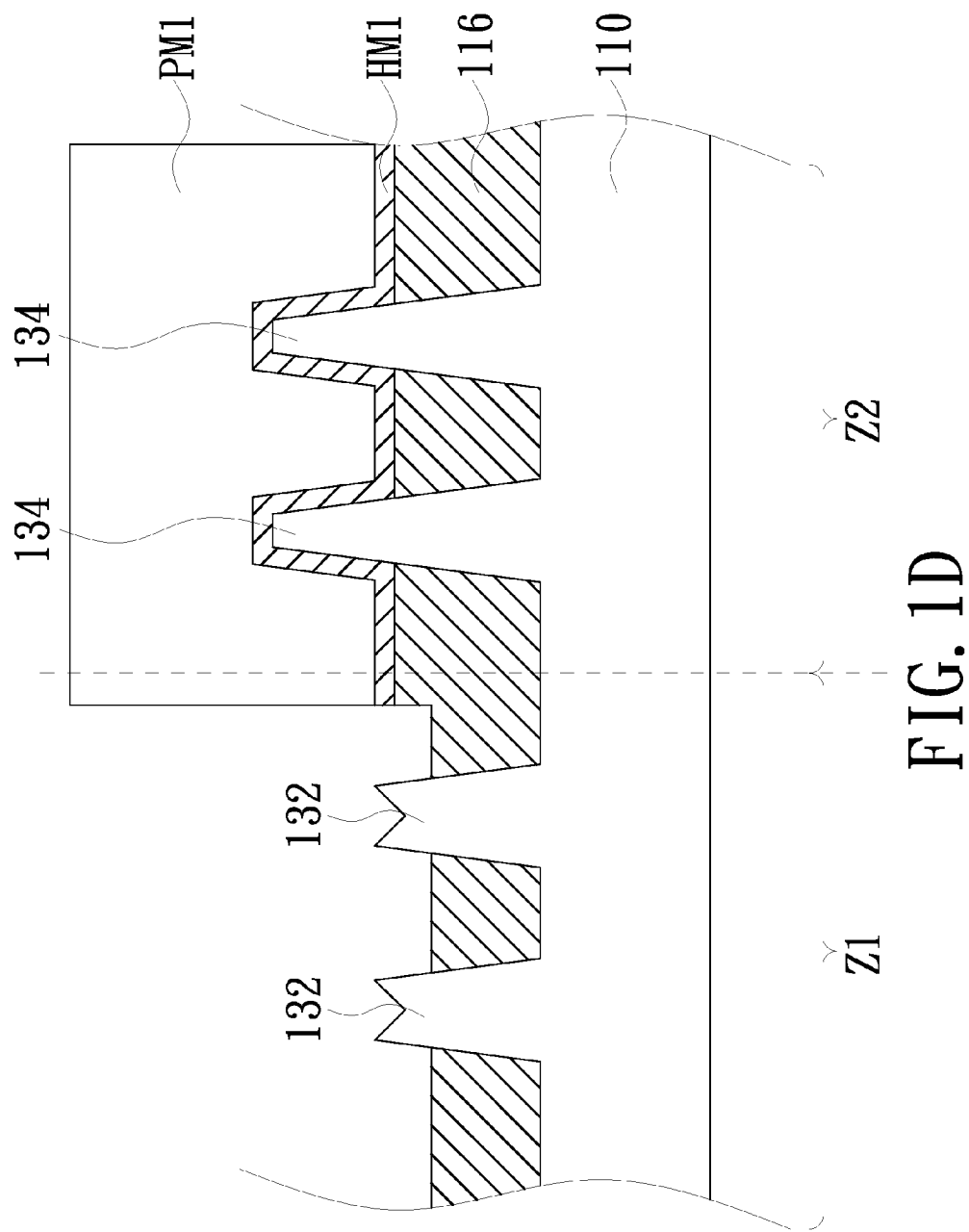
Figure 1E:
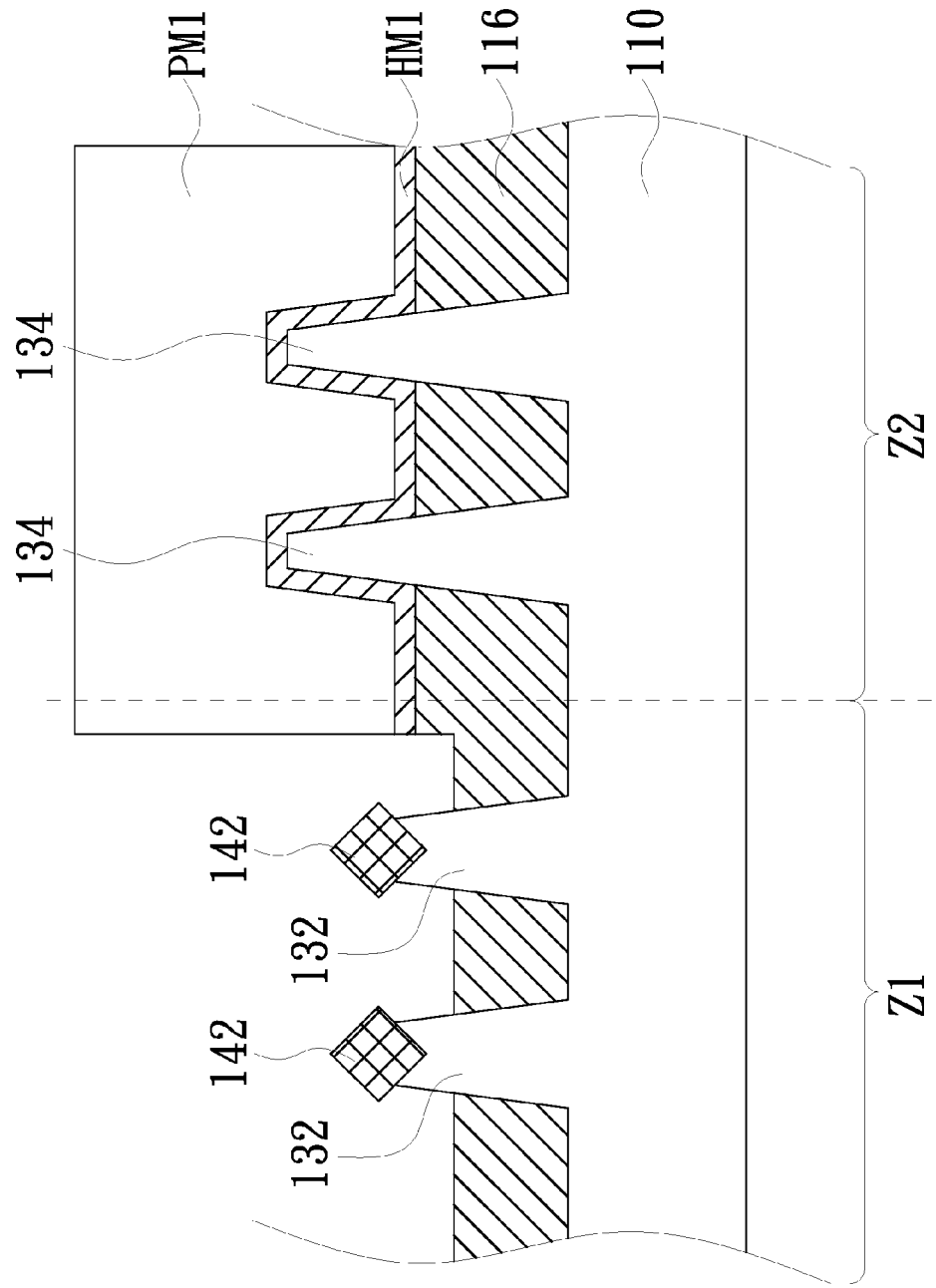

Please refer to FIGS. 1C~1E. After forming the first hard mask HM1, the method for manufacturing the FINFET structure of the embodiment further includes steps of: forming a first photomask PM1 to cover the second fin structures 134, wherein the first photomask PM1 is disposed in the second area Z2, and a portion of the first photomask PM1 is disposed in the first area Z1 (as shown in FIG. 1C); performing a first etching process to remove the first hard mask HM1 and a portion of the insulation layer 116 which are uncovered by the first photomask PM1, and to shorten a portion of the first fin structures 132 (as shown in FIG. 1D), wherein the first etching process is, for example, a dry etching process; and depositing a plurality of first top layers 142 on the (shortened) first fin structures 132 (as shown in FIG. 1E), wherein the first top layers 142 have a material of epitaxial silicide phosphorus (SiP).

Figure 1F:
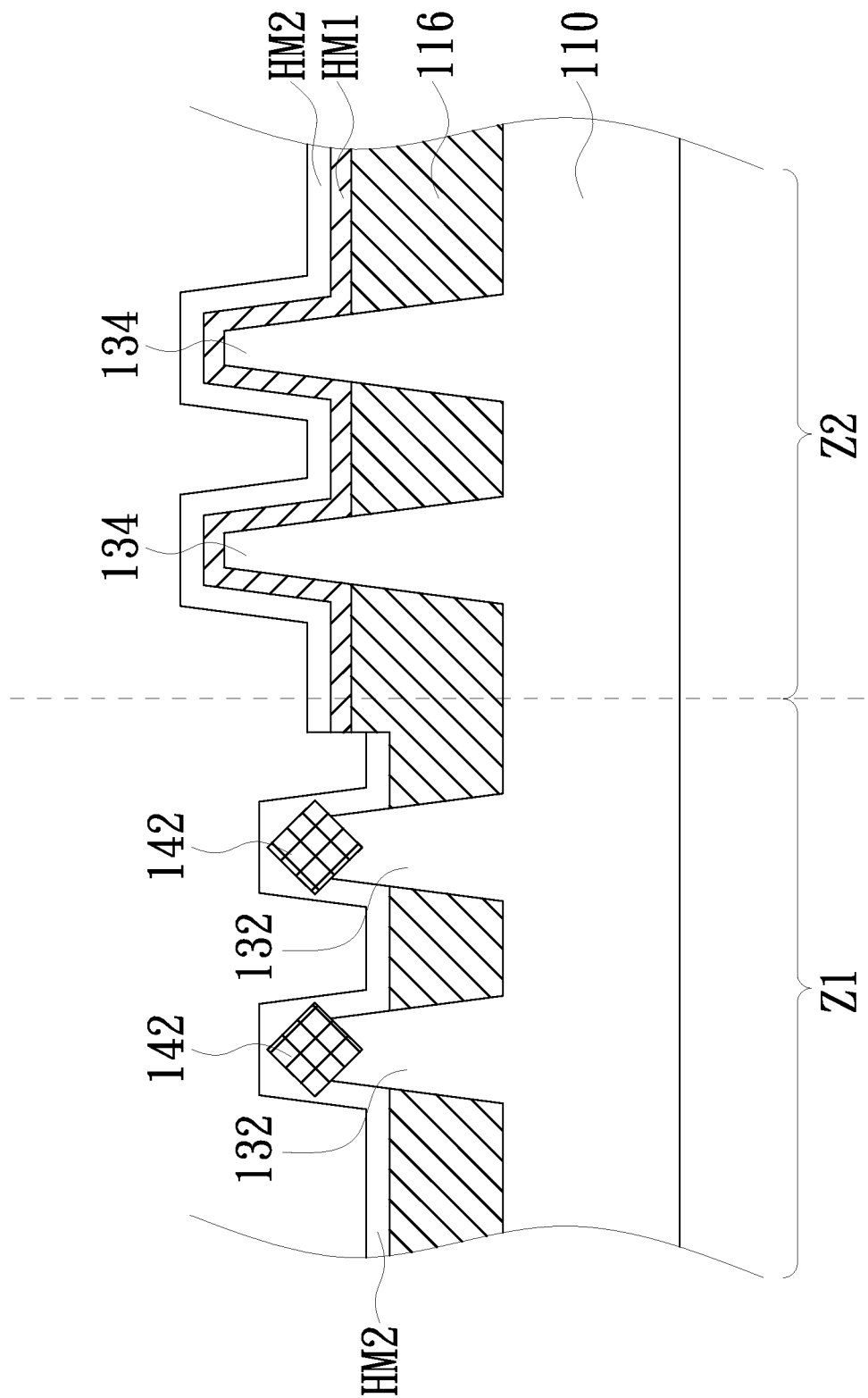
Figure 1G:
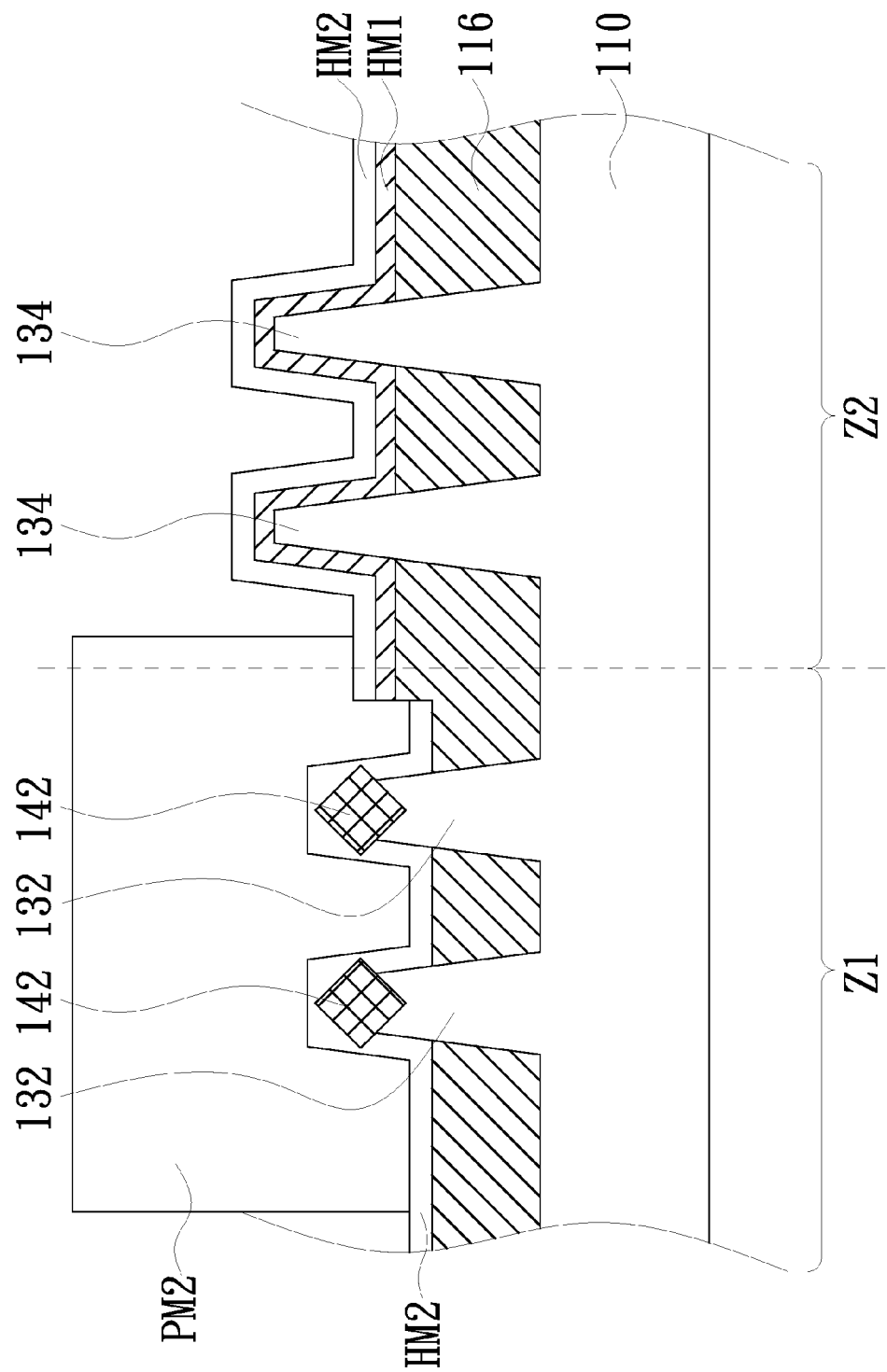
Figure 1H:
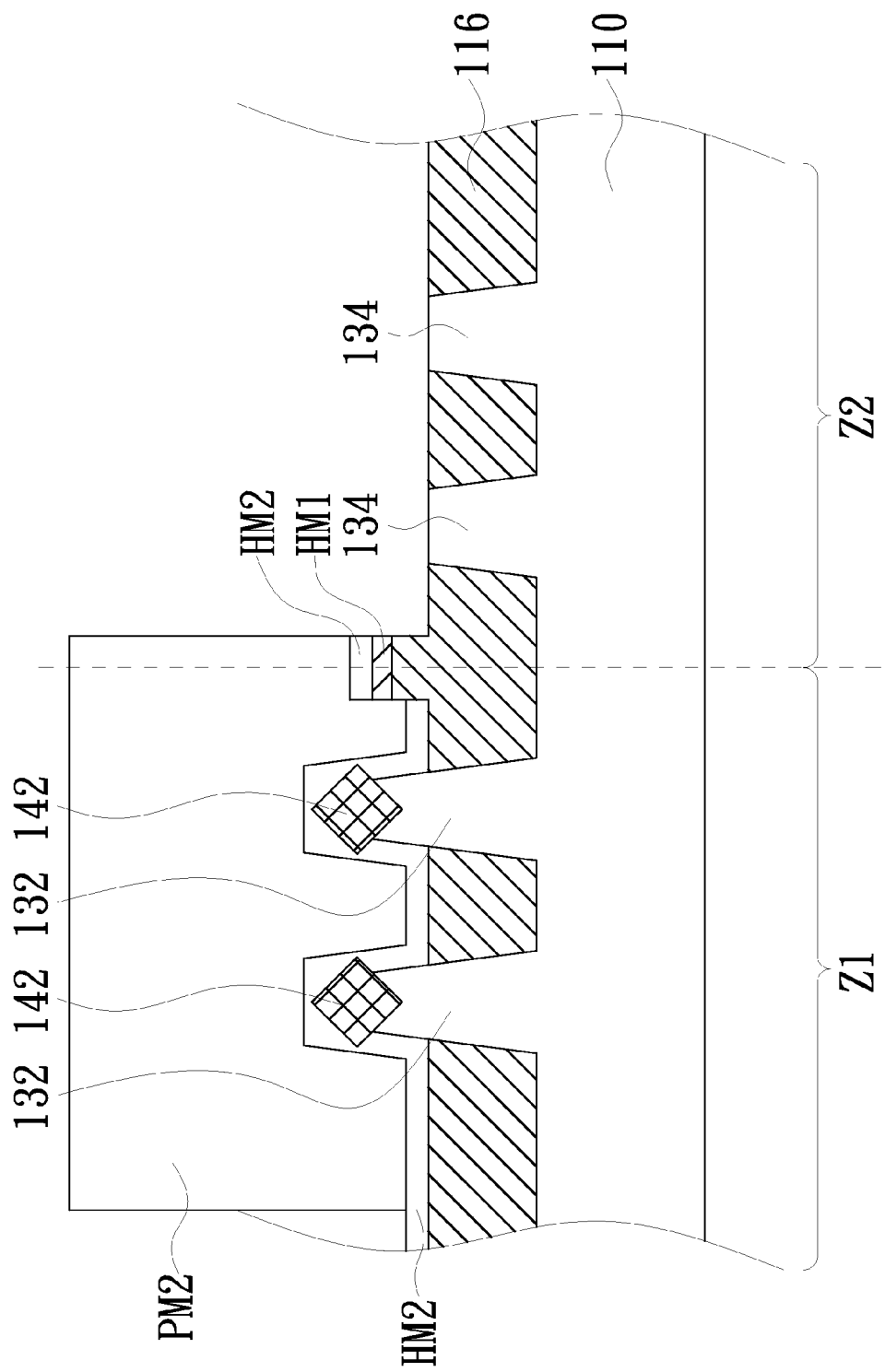
Figure 1I:
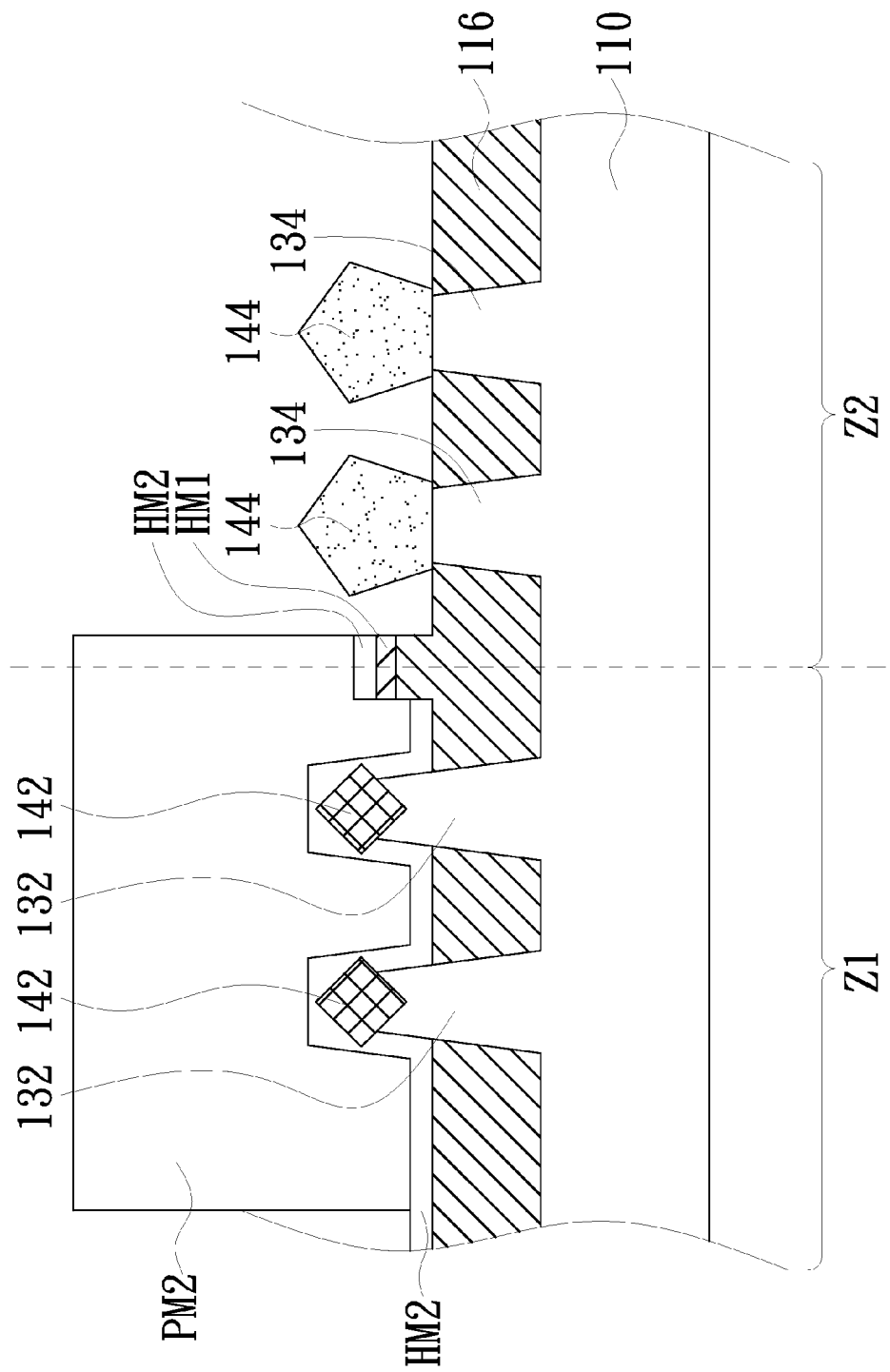

Please refer to FIGS. 1F~1I. After depositing the first top layers 142 on the first fin structures 132, the method for manufacturing the FINFET structure of the embodiment further includes steps of: removing the first photomask PM1, and forming a second hard mask HM2 on the first fin structures 132, on the insulation layer 116 uncovered by the first hard mask HM1, and conformally on the first hard mask HM1 (as shown in FIG. 1F), wherein the second hard mask HM2 has a material of SiN, for example; forming a second photomask PM2 to cover the second hard mask HM2 which is disposed in the first area Z1 and also to cover a portion of the second hard mask HM2 which is disposed in the second area Z2 (as shown in FIG. 1G); performing a second etching process to remove the second hard mask HM2 and the first hard mask HM1 which are uncovered by the second photomask PM2, as well as to remove a portion of the second fin structures 134 and a portion of the insulation layer 116 to make the second fin structures 134 and the insulation layer 116 have the same level (as shown in FIG. 1H); and depositing a plurality of second top layers 144 on the second fin structures 134, wherein the second top layers 144 have a material of epitaxial SiGe (as shown in FIG. 1I).

Figure 1J:
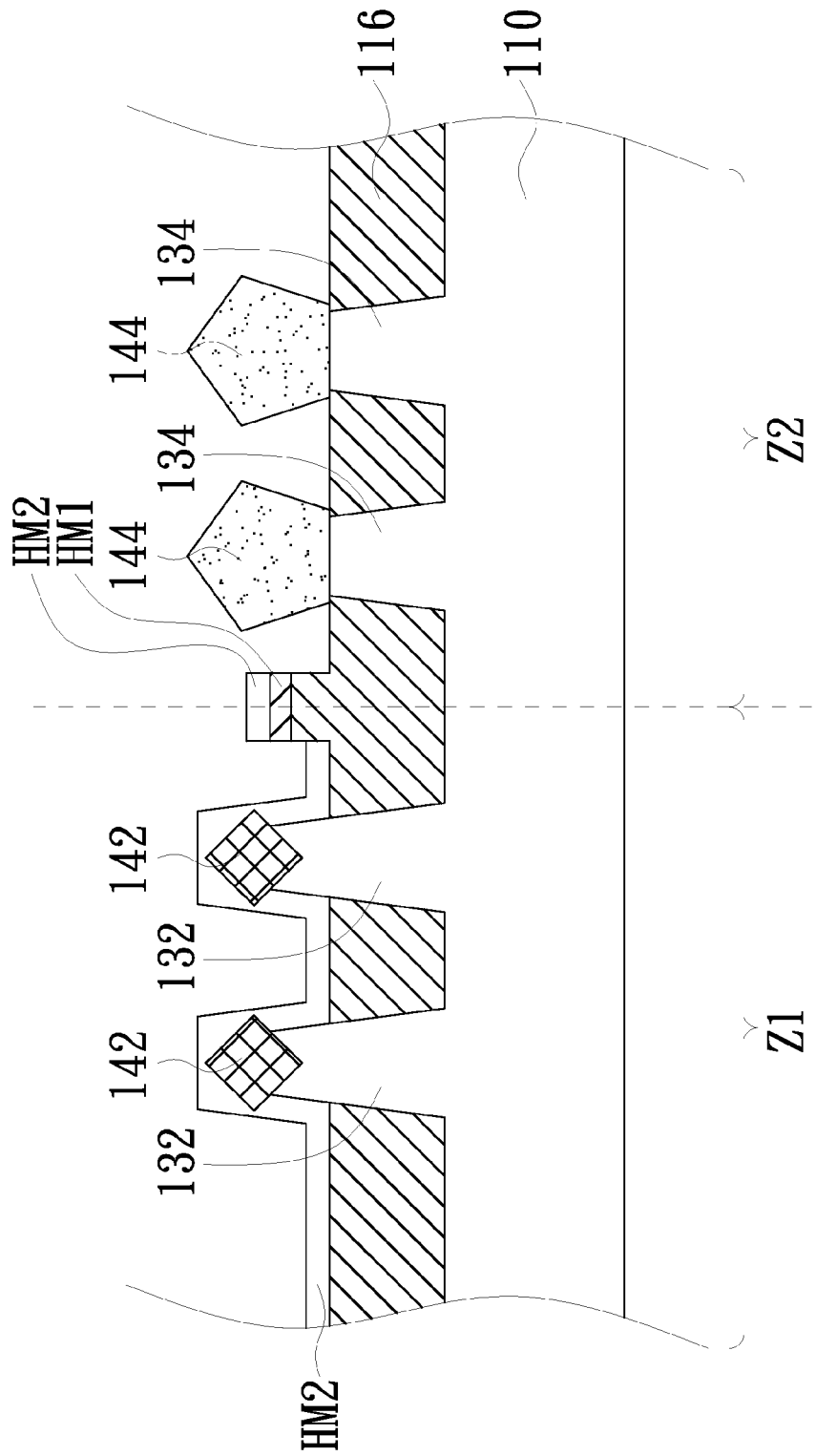
Figure 1K:
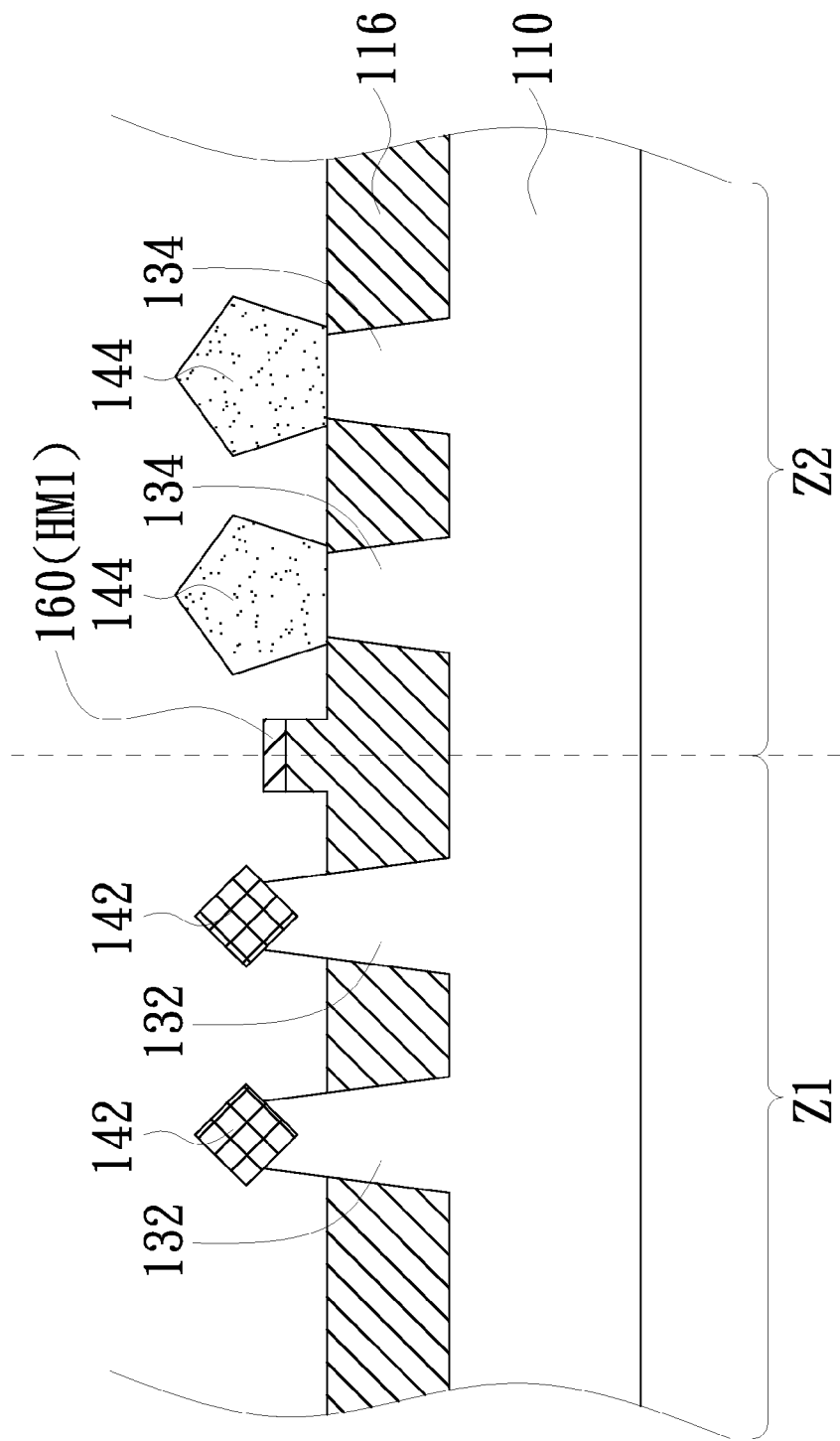

Please refer to FIGS. 1J~1K. After depositing the second top layers 144 on the second fin structures 134, the method for manufacturing the FINFET structure of the embodiment further includes steps of: removing the second photomask PM2 (as shown in FIG. 1J), wherein the first hard mask HM1 and the second hard mask HM2 are remained on a bumped (slightly raised or elevated) part of the insulation layer 116 that had been overlaid by the first photomask PM1 and the second photomask PM2 sequentially; and performing a wet etching process to remove the second hard mask HM2 (as shown in FIG. 1K), wherein an etching solution used in the wet etching process is, for example, a hot phosphoric acid.

It is worth mentioning that the hot phosphoric acid can be used in etching the second hard mask HM2 having the material of SiN, but cannot be used in etching the first hard mask HM1 having the carbon-containing dielectric material of SiCN. So after performing the wet etching process, the second hard mask HM2 is removed and the first hard mask HM1 disposed on the bumped part of the insulation layer 116 is still remained, wherein the remained first hard mask HM1 is also disposed on a boundary of the first area Z1 and the second area Z2. A portion of the insulation layer 116 disposed between the first fin structure 132 and the second fin structure 134 serves as a STI structure 150, wherein the STI structure 150 includes the bumped part of the insulation layer 116. The remained first hard mask HM1 disposed on the STI structure 150 serves as a bump structure 160 (as shown in FIG. 1K). The bump structure 160 has the carbon-containing dielectric material of SiCN, and is used for enhancing a height of whole insulation structure including the STI structure 150 and the bump structure 160, so it can make the FINFET structure have better efficiency in preventing ion penetration issues and leakage current issues.

Figure 1L:
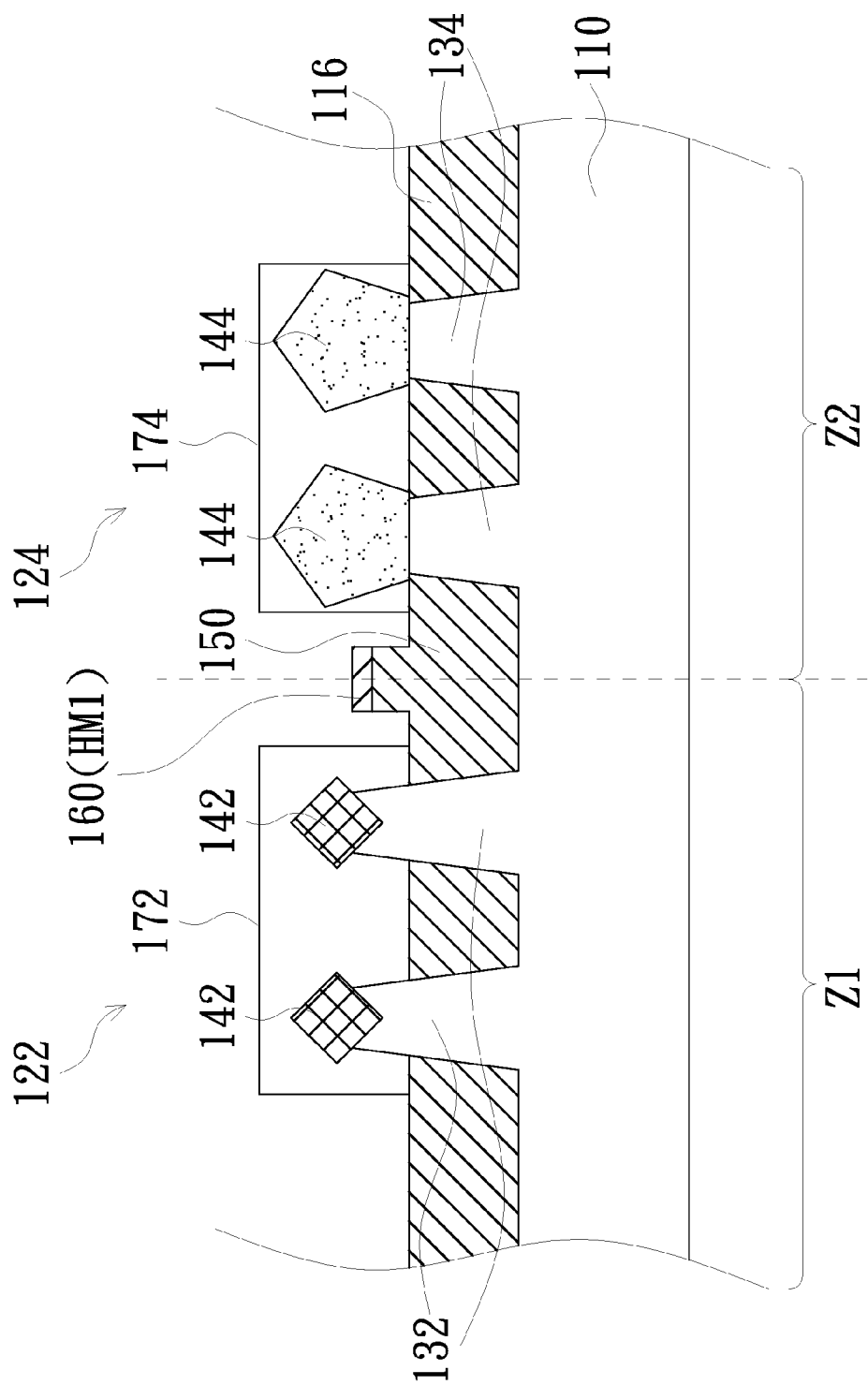

In addition, the method for manufacturing the FINFET structure further includes a step of forming a first gate structure 172 on the first fin structures 132 and forming a second gate structure 174 on the second fin structures 134 (as shown in FIG. 1L), so as to form a PMOS FINFET 122 including the first fin structures 132 and the first gate structure 172, as well as to form a NMOS FINFET 124 including the second fin structures 134 and the second gate structure 174.

Figure 2:
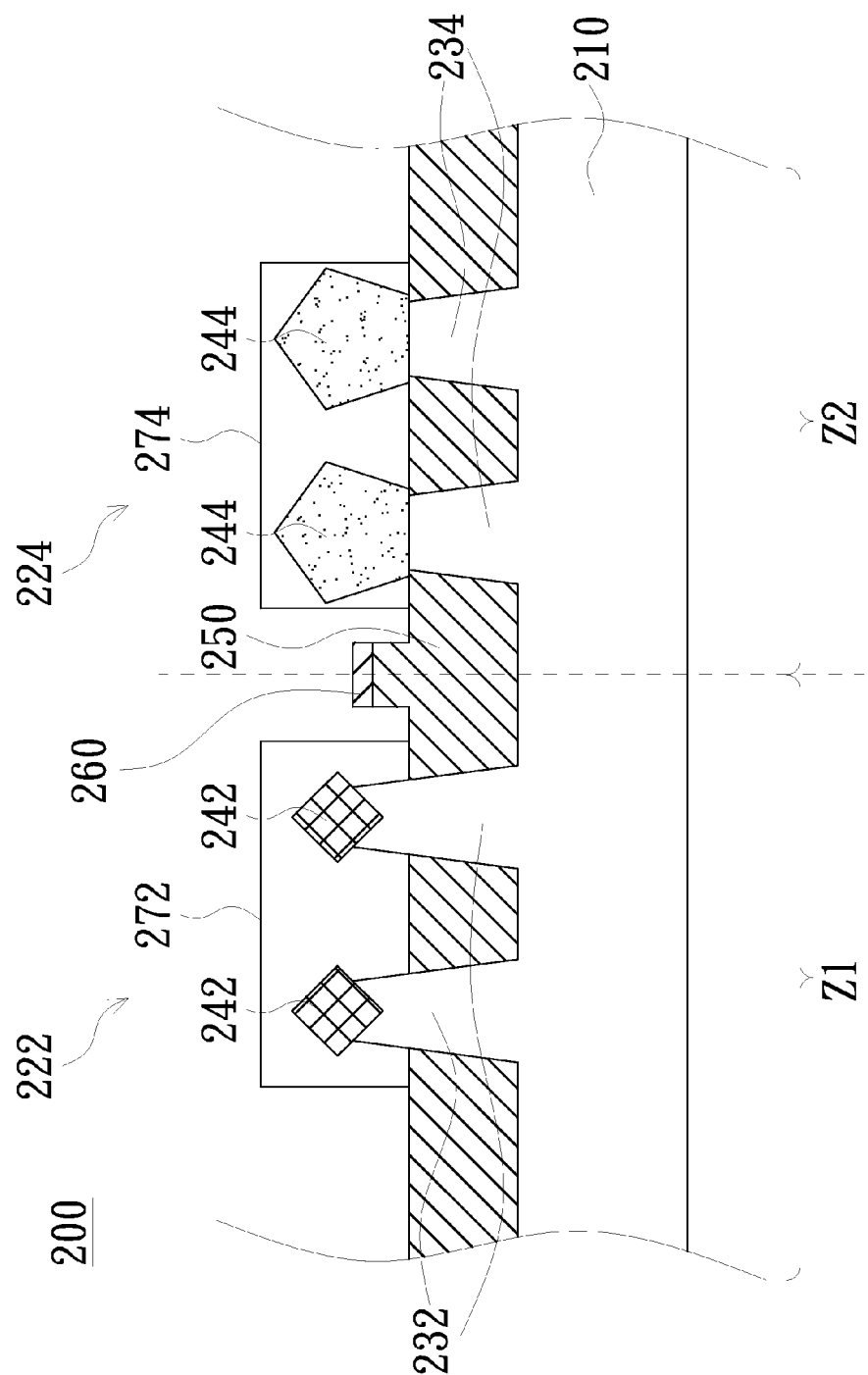
FIG. 2 is a schematic diagram illustrating a FINFET structure according to another embodiment of the present invention.

FIG. 2 is a schematic diagram illustrating a FINFET structure according to another embodiment of the present invention. Please refer to FIG. 2. The FINFET structure 200 of the another embodiment includes a substrate 210, a PMOS (P-channel MOSFET) element 222, a NMOS (N-channel MOSFET) element 224, a STI (Shallow Trench Isolation) structure 250, and a bump structure 260. The PMOS element 222 is a PMOS FINFET, and the NMOS element 224 is a NMOS FINFET.

The substrate 210 includes a first area Z1 and a second area Z2 adjacent to the first area Z1. The PMOS element 222 is disposed in the first area Z1 of the substrate 210, and includes at least one first fin structure 232 and a first gate structure 272 formed on the first fin structure 232, wherein the first fin structure 232 has a first top layer of epitaxial SiP 242. The NMOS element 224 is disposed in the second area Z2 of the substrate 210, and includes at least one second fin structure 234 and a second gate structure 274 formed on the second fin structure 234, wherein the second fin structure 234 has a second top layer of epitaxial SiGe 244. The STI structure 250 is disposed between the first fin structure 232 and the second fin structure 234. In other words, the STI structure 250 is also disposed between the PMOS FINFET 222 and the NMOS FINFET 224. The bump structure 260 is disposed on the STI structure 250 and configured to enhance isolation capability of the STI structure 250, so the bump structure 260 has a carbon-containing dielectric material. The carbon-containing dielectric material is SiCN, for instance. The bump structure 260 can enhance or increase a height of the whole insulation structure including the STI structure 250 and the bump structure 260 (taken as a whole), so it can make the FINFET structure (i.e. the PMOS FINFET 222 and the NMOS FINFET 224) have better efficiency in preventing ion penetration issues and leakage current issues.

In summary, by disposing the bump structure having a carbon-containing dielectric material on the STI structure, embodiments of present invention can improve insulation capability of the STI structure and improve efficiency of the FINFET structure in preventing ion penetration issues and leakage current issues.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A FINFET structure, comprising:
   a substrate, including a first area and a second area adjacent to the first area;
   a PMOS element, disposed in the first area of the substrate, and including at least one first fin structure;
   a NMOS element, disposed in the second area of the substrate, and including at least one second fin structure;
   a STI structure, disposed between the first fin structure and the second fin structure, wherein the STI structure has a bumped part, and the bumped part has a top surface and a side wall; and
   a bump structure, disposed on the STI structure and covering only and entirely the top surface of the bumped part of the STI structure, wherein the bump structure is of a single material and the single material is a carbon-containing dielectric material.

2. The FINFET structure according to claim 1, wherein the second fin structure has a second top layer of epitaxial SiGe.

3. The FINFET structure according to claim 1, wherein the PMOS element further includes a first gate structure formed on the first fin structure.

4. The FINFET structure according to claim 1, wherein the NMOS element further includes a second gate structure formed on the second fin structure.

5. The FINFET structure according to claim 1, wherein the carbon-containing dielectric material is SiCN.

* * * * *